(12) United States Patent
Yamamoto et al.

(10) Patent No.: US 8,723,157 B2
(45) Date of Patent: May 13, 2014

(54) NON-VOLATILE SEMICONDUCTOR STORAGE DEVICE AND METHOD OF MANUFACTURING THE SAME

(71) Applicant: Kabushiki Kaisha Toshiba, Minato-ku (JP)

(72) Inventors: Kazuhiko Yamamoto, Yokohama (JP); Yasuyuki Baba, Yokohama (JP); Takuya Konno, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/029,943

(22) Filed: Sep. 18, 2013

(65) Prior Publication Data

US 2014/0016398 A1  Jan. 16, 2014

Related U.S. Application Data

(62) Division of application No. 12/508,877, filed on Jul. 24, 2009.

(30) Foreign Application Priority Data

Feb. 20, 2009  (JP) .................................. 2009-037645

(51) Int. Cl.
  *H01L 47/00*  (2006.01)
(52) U.S. Cl.
  USPC ............ 257/4; 257/1; 257/2; 257/5; 257/536; 257/E45.002; 438/210; 438/382; 365/148; 365/175
(58) Field of Classification Search
  USPC ..................... 257/1, 2, 3, 4, 5, 528, 536, 537, 257/E27.016, E27.024, E27.033, E27.044, 257/E27.047, E27.071, E45.002; 438/210, 438/238, 329, 330, 381, 382; 365/148, 175
  See application file for complete search history.

(56) References Cited

U.S. PATENT DOCUMENTS

| 6,858,481 B2 | 2/2005 | Krieger et al. |
| 6,894,304 B2 | 5/2005 | Moore |
| 2004/0161888 A1 | 8/2004 | Rinerson et al. |
| 2006/0118848 A1 | 6/2006 | Kozicki et al. |

(Continued)

FOREIGN PATENT DOCUMENTS

| JP | 2008-192995 | 8/2008 |
| WO | WO 2010/029634 A1 | 3/2010 |

OTHER PUBLICATIONS

P. Vettiger et al., "The Millipede—Nanotechnology Entering Data Storage", IEEE Transactions of Nanotechnology, vol. 1, No. 1, Mar. 2002, pp. 39-55.

(Continued)

*Primary Examiner* — Eduardo A Rodela
(74) *Attorney, Agent, or Firm* — Oblon, Spivak, McClelland, Maier & Neustadt, L.L.P.

(57) ABSTRACT

A non-volatile semiconductor storage device includes memory cells, each of which is arranged at an intersection between a first wiring and a second wiring intersecting each other. Each of the memory cells includes: a first electrode layer; a plurality of variable resistance layers laminated on the first electrode layer and functioning as variable resistance elements; a second electrode layer formed between the variable resistance layers; and a third electrode layer formed on the top one of the variable resistance layers. Each of the variable resistance layers is composed of a material containing carbon.

14 Claims, 10 Drawing Sheets

(56) References Cited

U.S. PATENT DOCUMENTS

| | | |
|---|---|---|
| 2006/0120205 A1 | 6/2006 | Odagawa et al. |
| 2006/0231823 A1* | 10/2006 | Moore et al. .................. 257/2 |
| 2008/0093710 A1 | 4/2008 | Bach |
| 2008/0273370 A1* | 11/2008 | Keller et al. .................. 365/148 |
| 2010/0032643 A1 | 2/2010 | Xu |
| 2010/0157651 A1 | 6/2010 | Kumar et al. |
| 2010/0163824 A1 | 7/2010 | Xu et al. |

OTHER PUBLICATIONS

P. Vettiger et al., "Thousands of Microcantilevers for Highly Parallel and Ultra-dense Data Storage", Technical Digest, IEDM 2003, pp. 763-766.

* cited by examiner

NON-VOLATILE SEMICONDUCTOR STORAGE DEVICE AND METHOD OF MANUFACTURING THE SAME

CROSS-REFERENCE TO RELATED APPLICATIONS

This application is a division of and claims the benefit of priority under 35 U.S.C. §120 from U.S. Ser. No. 12/508,877, filed Jul. 24, 2009, and claims the benefit of priority from the prior Japanese Patent Application No. 2009-37645, filed on Feb. 20, 2009, the entire contents of which are incorporated herein by reference.

BACKGROUND OF THE INVENTION

1. Field of the Invention

The present invention relates to a non-volatile semiconductor storage device with a multi-layer structure of laminated memory cells and a method of manufacturing the same.

2. Description of the Related Art

With the popularization of mobile devices as well as the increase in the amount of data to be processed, demand for small, portable and large capacity non-volatile memory devices has grown. For example, NAND-type flash memory constitutes a large market that has been used for many applications, including mobile phones, digital cameras, digital movie cameras, etc. However, the flash memory has a limited number of rewrite cycles due to degradation in characteristics associated with charge injection into recording layers. In addition, problems arise due to insufficient information write and read rate. Therefore, there is a demand for new non-volatile memory elements to replace the above-mentioned flash memory. As one example, non-volatile memory elements have attracted public attention that utilize variable resistance type memory cells where information is stored by changing resistance states in a reversible manner (e.g., Non-Patent Document 1: P. Vettiger, G. Cross, M. Despont, U. Drechsler, U. Durig, B. Gotsmann, W. Haberle, M. A. Lants, H. E. Rothuizen, R. Stutz and G. K. Binnig, IEEE Trans. Nanotechnology 1, 39 (2002); Non-Patent Document 2: P. Vettiger, T. Albrecht, M. Despont, U. Drechsler, U. Durig, B. Gotsmann, D. Jubin, W. Haberle, M. A. Lants, H. E. Rothuizen, R. Stutz, D. Wiesmann and G. K. Binnig, P. Bachtold, G. Cherubini, C. Hagleitner, T. Loeliger, A. Pantazi, H. Pozidis and E. Eleftheriou, in Technical Digest, IEDM03 pp. 763-766).

A variable resistance type memory cell generally includes a variable resistance layer and electrodes sandwiching the variable resistance layer. The variable resistance layer, which may take two or more different electrical resistance states, records the difference in resistance values in correspondence with data, by changing the resistance state of the variable resistance layer through application of certain threshold voltage, threshold current, and threshold charge between the electrodes. Furthermore, the variable resistance layer includes a feature that it may read such data without any destruction.

For example, metal oxide has been recently proposed as material of variable resistance layers, including multicomponent oxide such as nickel oxide (NiO) or strontium zirconium oxide ($SrZrO_3$). The metal compounds are uniformly deposited on a lower electrode layer using physical or chemical schemes. An upper electrode is further laminated thereon. As a result, a memory cell structure is created. In general, while the metal oxide material can readily provide a uniform film property, it will be in an electrically high-resistance state just after deposition. As such, it requires an operation referred to as "forming": high voltage is applied across the memory cell, thereby causing a large current to flow through the metal oxide. This large current creates a region where a local current easily flows within the metal oxide, i.e., a minute current path which is so-called "filament path". As a result, the memory cell structure will be operable as a storage element. This operation will be referred to hereinafter as "forming". After this forming process, applying a voltage greater than a certain threshold value causes a filament path to be cut off or restored repeatedly, changing the electrical resistance value of the corresponding memory cell. As a result, data is written to the memory cell. Note that if the applied voltage is not more than the threshold voltage, the resistance value remains unchanged, which value may then be read as information.

However, the voltage for use in a forming process with respect to a memory cell with a metal oxide film is larger than the threshold voltage required for normal variable resistance switching. Thus, a huge current will flow at the instant when resistance of a variable resistance element changes from a high resistance state to a low resistance state during the forming process. This excessive current may result in destruction of wirings, transistors, diodes, or the like. Therefore, it is desirable to perform the forming process with a low voltage.

In addition, it is necessary to fabricate a uniform filament path in a metal oxide film for providing stable elements' characteristics. Uniform current paths with suitable size should be formed at appropriate positions, for otherwise variations of the elements' characteristics cannot be reduced or operational errors would occur, which could reduce the yield.

To avoid any operational errors, additional circuits, referred to as redundant repair circuits, are required for isolating any faulty bits. However, the more the faulty bits, the larger the area to be reserved for redundant repair circuits, which would result in larger chip area, i.e., increased manufacturing costs.

SUMMARY OF THE INVENTION

One aspect of the present invention provides a non-volatile semiconductor storage device comprising memory cells, each memory cell arranged at an intersection between a first wiring and a second wiring intersecting each other, each of the memory cells comprising: a first electrode layer; a plurality of variable resistance layers laminated on the first electrode layer and functioning as variable resistance elements; a second electrode layer formed between the variable resistance layers; and a third electrode layer formed on the top one of the variable resistance layers, each of the variable resistance layers being composed of a material containing carbon.

Another aspect of the present invention provides a method of manufacturing a non-volatile semiconductor storage device having memory cells, each memory cell arranged at an intersection between a first wiring and a second wiring intersecting each other, the method comprising: depositing a first electrode layer; laminating, over the first electrode layer, a plurality of variable resistance layers functioning as variable resistance elements, and a second electrode layer so as to be sandwiched between the variable resistance layers above and below; depositing a third electrode layer over the top one of the variable resistance layers; and composing each of the variable resistance layers of a material containing carbon.

DETAILED DESCRIPTION OF THE EMBODIMENTS

Embodiments of a non-volatile semiconductor storage device according to the present invention will now be described below with reference to the accompanying drawings.

First Embodiment

[Circuit Configuration of Non-Volatile Semiconductor Storage Device in First Embodiment]

Figure 1:
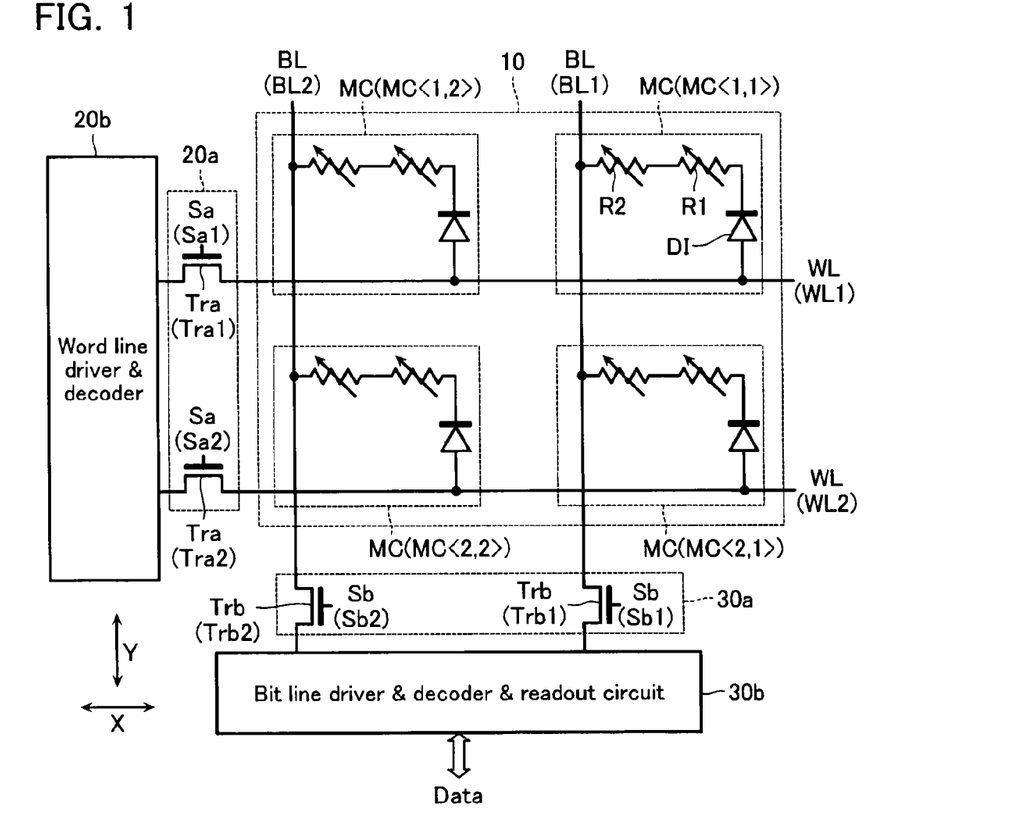
FIG. 1 is a circuit diagram of a non-volatile semiconductor storage device according to a first embodiment of the present invention.

Referring first to FIG. 1, a circuit configuration of a non-volatile semiconductor storage device according to a first embodiment of the present invention will be described below. FIG. 1 is a circuit diagram of the non-volatile semiconductor storage device according to the first embodiment.

As illustrated in FIG. 1, the non-volatile semiconductor storage device in the first embodiment comprises: a memory cell array 10; a word-line selection circuit 20a; a word-line driving circuit 20b; a bit-line selection circuit 30a; and a bit-line driving circuit 30b.

As illustrated in FIG. 1, the memory cell array 10 includes word lines WL (WL1, WL2) and bit lines BL (BL1, BL2) intersecting each other, and memory cells MC (MC<1,1> to MC<2,2>) positioned at respective intersections between the word lines WL and the bit lines BL. The word lines WL are arranged in the y direction with a predetermined pitch, and formed to extend in the x direction. The bit lines BL are arranged in the x direction with a predetermined pitch, and formed to extend in the y direction. That is, the memory cells MC are positioned in a matrix form on respective surfaces formed in the x and y directions.

As illustrated in FIG. 1, each of the memory cells MC includes a diode DI and variable resistance elements R1, R2. Each diode DI has an anode connected to the corresponding word line WL and a cathode connected to one end of the corresponding variable resistance element R1. The variable resistance elements R1 and R2 are electrically rewritable and store data in a non-volatile manner based on the resistance values. The variable resistance elements R1 and R2 are connected in series. The other ends of the variable resistance elements R2 are connected to the bit lines BL.

As illustrated in FIG. 1, the word-line selection circuit 20a has a plurality of selection transistors Tra (Tra1 and Tra2). One ends of the selection transistors Tra are connected to one ends of the corresponding word lines WL, and the other ends connected to the word-line driving circuit 20b. Signals Sa (Sa1 and Sa2) are supplied to the gates of the selection transistors Tra. That is, the word-line selection circuit 20a controls the signals Sa to selectively connect the word lines WL to the word-line driving circuit 20b.

As illustrated in FIG. 1, the word-line driving circuit 20b applies a voltage to a word line WL that is required for erasing data from, writing data to, and reading data from a memory cell MC.

As illustrated in FIG. 1, the bit-line selection circuit 30a has a plurality of selection transistors Trb (Trb1 and Trb2). One ends of the selection transistors Trb are connected to one ends of the corresponding bit lines BL, and the other ends connected to the bit-line driving circuit 30b. Signals Sb (Sb1 and Sb2) are supplied to the gates of the selection transistors Trb. That is, the bit-line selection circuit 30a controls the signals Sb to selectively connect the bit lines BL to the bit-line driving circuit 30b.

As illustrated in FIG. 1, the bit-line driving circuit 30b applies a voltage to a bit line BL that is required for erasing data from, writing data to, and reading data from a memory cell MC. In addition, the bit-line driving circuit 30b outputs the data read from a bit line BL to outside.

[Lamination Structure of Memory Cell Array 10 in First Embodiment]

Figure 2:
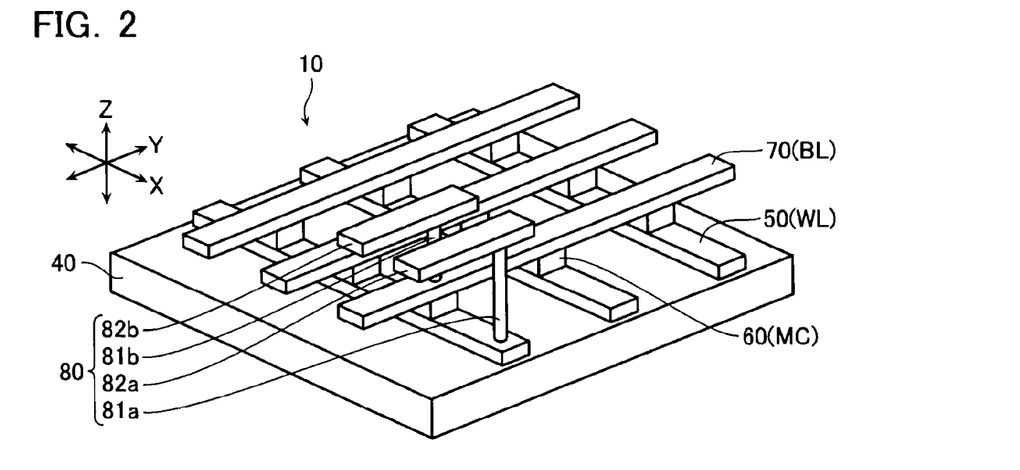
FIG. 2 is an enlarged perspective view of a memory cell array 10 according to the first embodiment.
Figure 3:
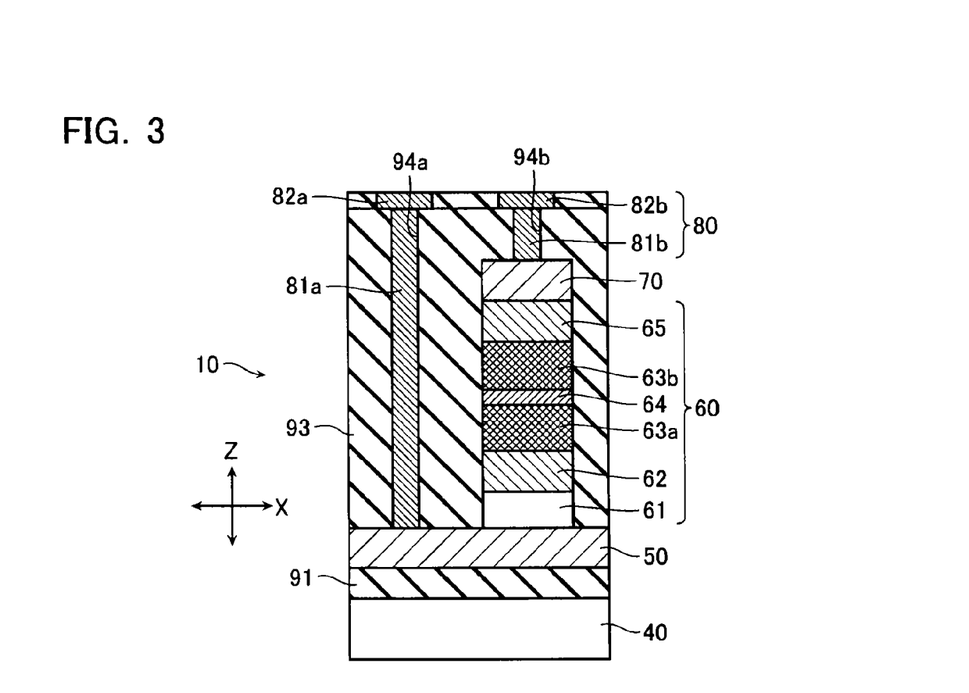
FIG. 3 is a cross-sectional view of FIG. 2.

Referring now to FIGS. 2 and 3, a lamination structure of a memory cell array 10 according to the first embodiment will be described below. FIG. 2 is an enlarged view of a memory cell array 10 according to the first embodiment.

As illustrated in FIG. 2, the memory cell array 10 is formed over a substrate 40. The memory cell array 10 has, from lower layer to upper layer, first conductive layers 50, memory layers 60, second conductive layers 70, and a wiring layer 80. The first conductive layers 50 function as word lines WL. The memory layers 60 function as memory cells MC. The second conductive layers 70 function as bit lines BL.

As illustrated in FIG. 2, the first conductive layers 50 are formed to extend in the x direction in a stripe form with a predetermined pitch in the y direction. The first conductive layers 50 are composed of metal. The first conductive layers 50 are preferably composed of a heat-resistant and low-resistance material, e.g., tungsten (W), titanium (Ti), tantalum (Ta), and a nitride thereof, or a lamination structure thereof.

As illustrated in FIG. 2, the memory layers 60 are provided on the first conductive layers 50 and arranged in a matrix form in the x and y directions.

As illustrated in FIG. 2, the second conductive layers 70 are formed to extend in the y direction in a stripe form with a predetermined pitch in the x direction. The second conductive layers 70 are formed in contact with the respective top surfaces of the memory layers 60. The second conductive layers 70 are preferably composed of a heat-resistant and low-resistance material, e.g., tungsten (W), titanium (Ti), tantalum (Ta), and a nitride thereof, or a lamination structure thereof.

As illustrated in FIG. 2, the wiring layer 80 includes first and second plug layers 81a and 81b as well as first and second wiring layers 82a and 82b. The first plug layer 81a is formed to extend in the lamination direction from the top surface of a first conductive layer 50. The second plug layer 81b is formed to extend in the lamination direction from the top surface of a second conductive layer 70. The first wiring layer 82a is formed in contact with the top surface of the first plug layer 81a. The second wiring layer 82b is formed in contact with the top surface of the second plug layer 81b.

Referring now to FIG. 3, the lamination structure of the respective layers will be described in detail below. FIG. 3 is a cross-sectional view of FIG. 2.

As illustrated in FIG. 3, a first conductive layer 50 is formed on the substrate 40 via an interlayer insulation layer 91. The interlayer insulation layer 91 is composed of a silicon oxide film, such as TEOS (Tetra Ethoxy Silane Si $(OC_2H_5)_4$)), BSG (Boron Silicate Glass), or p-$SiO_2$ (plasma silicon oxide film).

As illustrated in FIG. 3, a memory layer 60 has, from lower layer to upper layer, a diode layer 61, a first electrode layer 62, a variable resistance layers 63a, a second electrode layer 64, a variable resistance layers 63b, and a third electrode layer 65. Note that the memory layer 60 has a device size of not more than several tens of $\mu m^2$.

The diode layer 61 is formed on the top surface of the first conductive layer 50. The diode layer 61 functions as a diode DI. The diode layer 61 includes, for example, MIM (Metal-Insulator-Metal) structure, PIN structure (P+poly-Silicon-Intrinsic-N+poly-Silicon), or the like.

The first electrode layer 62 is formed on the top surface of the diode layer 61. The first electrode layer 62 is composed of any of titanium (Ti), zirconium (Zr), hafnium (Hf), tantalum (Ta), tungsten (W), aluminum (Al), silicon (Si), ruthenium (Ru), iridium (Ir), or platinum (Pt), an alloy thereof, or a nitride thereof.

A variable resistance layer 63a is formed on the top surface of the first electrode layer 62. The variable resistance layer 63a functions as a variable resistance element R1. The variable resistance layer 63a changes its electrical resistivity according to at least any one of the applied voltage, conducting current, or injected charges. The variable resistance layer 63a, which contains carbon, is configured to be in a low-resistance state during deposition. The variable resistance layer 63a has such a low-resistance state in which high voltage need not be applied to form a filament path. The variable resistance layer 63a has a hydrogen concentration of not more than 20%.

Specifically, the variable resistance layer 63a is composed of a mixture of a graphite component with a minute grain size and carbon with a coarse crystal structure (amorphous carbon). In addition, the variable resistance layer 63a may be composed in part or entirely of a carbon nanomaterial. In this case, the carbon nanomaterial has a steric structure of minute carbon in nano-order scale. For example, the carbon nanomaterial includes single-wall, double-wall, multi-wall carbon nanotubes and fullerenes.

The variable resistance layer 63a specifically changes the crystal structure of carbon from amorphous state to crystallized state in a reversible manner by means of the Joule heat generated by the conducting current, thereby changing its resistance. Alternatively, the variable resistance layer 63a specifically changes the bonding of carbon atoms from sp2-bonding to sp3-bonding by means of the Joule heat generated by the conducting current in a reversible manner, thereby changing its resistance.

The second electrode layer 64 is formed between the laminated variable resistance layers 63a and 63b. The second electrode layer 64 is composed of any of titanium, zirconium, hafnium, tantalum, tungsten, aluminum, silicon, ruthenium, iridium, or platinum, an alloy thereof, or a nitride thereof. For example, the second electrode layer 64 may be composed of a layer containing carbon and nitrogen (e.g., carbon nitride $(CN_X)$). The second electrode layer 64 may be of any material that is conductive and keeps its resistance state unchanged.

The variable resistance layer 63b is formed on the top surface of the second electrode layer 64. The variable resistance layer 63b has the same configuration as the above-mentioned variable resistance layer 63a.

The third electrode layer 65 is formed on the top surface of the variable resistance layer 63b. The top surface of the third electrode layer 65 is formed in contact with the bottom surface of a second conductive layer 70. The third electrode layer 65 has the same configuration as the first electrode layer 62. Note that the memory layer 60 mentioned above is covered with an interlayer insulation layer 93.

First and second plug layers 81a and 81b are formed to fill up holes 94a and 94b that penetrate the interlayer insulation layer 93. A hole 94a is formed to reach the top surface of a first conductive layer 50. A hole 94b is formed to reach the top surface of a second conductive layer 70.

[Write/Erase/Read Operations in First Embodiment]

Referring now to FIG. 1, write/erase/read operations will be described below according to the first embodiment. Hereinafter, consider that the memory cell MC<1,1> of FIG. 1 is selected to perform one of the above-described operations thereon.

[Write Operation]

Firstly, a write operation (setting operation) will be described below. In write operation, the potential of the selected word line WL1 is set to be relatively high compared to that of the selected bit line BL1. For example, a positive potential may be applied to the word line WL1 in order to set the bit line BL1 to the ground potential.

Through this step, a predetermined voltage is applied to the selected memory cell MC<1,1>, a potential gradient is created within the memory cell MC<1,1>, and a current pulse flows therethrough. Due to the current pulse, the variable resistance elements R1 and R2 change from a high-resistance state to a low-resistance state.

In addition, in this write operation, the voltage provided to the word line WL1 has a longer pulse width than that of the voltage provided in erase operation. That is, in write operation, voltage is applied to the word line WL1 for a longer period of time than in erase operation.

In addition, it is desirable that the non-selected word lines WL2 and the non-selected bit lines BL2 are all biased to the same potential in write operation. It is also desirable that all of the word lines WL1, WL2 and all of the bit lines BL1, BL2 are precharged during standby state before write operation.

[Erase Operation]

An erase operation (reset operation) will now be described below. In erase operation, the potential of the selected word line WL1 is set to be relatively high compared to that of the selected bit line BL1. For example, a positive potential may be applied to the word line WL1 in order to set the bit line BL1 to the ground potential.

Through this step, a large current pulse flows into the selected memory cell MC<1,1>, and an erase operation is performed by means of the resulting Joule heat and residual heat. Alternatively, an erase operation is performed by means of the applied voltage due to the large current pulse, or current energy itself. In erase operation, the variable resistance elements R1 and R2 change from a low-resistance state to a high-resistance state.

In addition, as described above, the voltage provided to the word line WL1 in this erase operation has a shorter pulse width than that of the voltage provided in write operation. That is, in erase operation, voltage is applied to the word line WL1 for a shorter period of time than in write operation. As can be seen from the above, erase operation and write operation may be performed separately using different pulse widths for erase operation and write operation.

[Read Operation]

A read operation will now be described below. In read operation, a current pulse (read current) is provided to the selected memory cell MC<1,1> from the selected bit line BL1. Then, the bit-line driving circuit 30b reads the current from the bit line BL1 and measures the resistance of the memory cell MC<1,1>, by which a read operation is performed.

[Manufacturing Method of Non-Volatile Semiconductor Storage Device in First Embodiment]

Referring now to FIGS. 4 to 10, a manufacturing process of the non-volatile semiconductor storage device according to the first embodiment will be described below. FIGS. 4 to 10 are schematic diagrams, each illustrating a manufacturing process of the non-volatile semiconductor storage device in the first embodiment.

Figure 4:
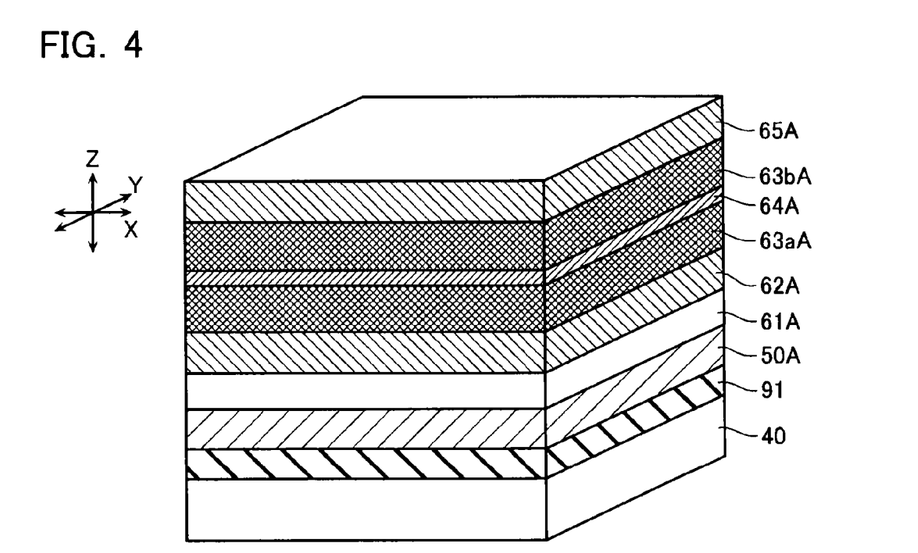
FIG. 4 is a schematic diagram illustrating a manufacturing process of the non-volatile semiconductor storage device according to the first embodiment.

Firstly, as illustrated in FIG. 4, 200 nm of TEOS is deposited on the substrate 40 of silicon (Si) using the low pressure CVD method to form an interlayer insulation layer 91. Subsequently, 5 nm of titanium (Ti) and 10 nm of titanium nitride (TiN) are deposited on the interlayer insulation layer 91 to form a layer 50A. The interlayer insulation layer 91 and the layer 50A are formed to expand in a two-dimensional manner in a direction parallel to the substrate 40.

In this case, the interlayer insulation layer 91 is provided to mitigate deficiencies due to the abnormal growth caused by reaction between the layer 50A (metal) and the substrate 40 (silicon). The interlayer insulation layer 91 is also provided to inhibit contact holes 94a and 94b from reaching the substrate 40.

In addition, titanium (Ti) is provided in the layer 50A to improve adhesion between titanium nitride (TiN) and the interlayer insulation layer 91, suppressing detachment therebetween. Furthermore, it is desirable that titanium nitride (TiN) in the layer 50A has a film thickness of not less than 5 nm, and not more than 50 nm. In this case, if the film thickness is less than 5 nm, then the titanium nitride is not flat at the atomic level due to its nucleus growth. On the contrary, if greater than 50 nm, then poor adhesion results due to wafer warpage caused by the layer stress. The layer 50A may be of tungsten (W), titanium (Ti), tantalum (Ta), and a nitride thereof, or a lamination structure thereof.

Subsequently, as illustrated in FIG. 4, layers 61A, 62A, 63aA, 64A, 63bA, and 65A are sequentially deposited on the layer 50A. These layers 61A, 62A, 63aA, 64A, 63bA, and 65A are formed to expand in a two-dimensional manner in a direction parallel to the substrate 40.

In this case, the above-mentioned manufacturing process illustrated in FIG. 4 can be restated as follows: The layer 62A is deposited on the layer 61A. Then, the two layers 63aA and 63bA are laminated over the layer 62A, and the layer 64A is laminated so that it is sandwiched between the layers 63aA and 63bA. Then, the layer 65A is further deposited over the top layer 63bA.

The layer 61A is composed of a MIM or PIN structure. The layer 62A is composed of any of titanium (Ti), zirconium (Zr), hafnium (Hf), tantalum (Ta), tungsten (W), aluminum (Al), silicon (Si), ruthenium (Ru), iridium (Ir), or platinum (Pt), an alloy thereof, or a nitride thereof. It is desirable that the layer 62A has a film thickness of not more than 50 nm.

The layer 63aA is configured to change its electrical resistivity according to at least any one of the applied voltage, conducting current, or injected charges. The layer 63aA, which contains carbon, is composed of a material film such that it will be in a low-resistance state during deposition without forming operation. It is desirable that the layer 63aA has a film thickness of not less than 10 nm, and not more than 100 nm. In this case, if the layer 63aA has a film thickness of less than 10 nm, then it has a low electrical resistance and excessive current flows into the layer 63aA, which would result in destruction of the element. On the contrary, if the layer 63aA has a film thickness of greater than 100 nm, then it has a high resistance, thus making it difficult for necessary current to flow into the layer 63aA.

For example, deposition of the layer 63aA is performed by providing source gas of propylene ($C_3H_6$) on the wafer together with helium (He) as carrier gas using the plasma Chemical Vapor Deposition (CVD) method, with wafer temperature at 500° C. and plasma discharge power at 300 W. Note that the source gas may be other hydrocarbon gas, e.g., acetylene ($C_2H_2$), etc. It is desirable that the deposition temperature is not less than 500° C. In this case, the lower the deposition temperature, the more the amorphous components and the higher the electrical resistance involved in the lamination structure, thus making it more difficult for the current necessary for switching to flow therethrough. In this embodiment, setting the deposition temperature at not less than 500° C. provides the crystal structure of the layer 63aA with a large amount of conductive graphite components, whereby the layer 63aA becomes conductive. Meanwhile, if the temperature is less than 500° C. at the time of deposition, the layer 63aA also becomes conductive through additional thermal treatment at not less than 500° C. after deposition. In addition, with the CVD method as described above, hydrocarbon gas is used as reaction gas, in which case hydrogen would possibly remain in the layer 63aA depending upon the deposition conditions. While the amount of residual hydrogen varies for different deposition conditions, it is desirably not more than 20 atomic percent. In this case, if the layer 63aA contains a large amount of hydrogen, then it reacts with a natural oxide layer formed on the layer 62A, which would result in reduced adhesion therebetween.

The layer 64A is composed of any of titanium, zirconium, hafnium, tantalum, tungsten, aluminum, silicon, ruthenium, iridium, or platinum, or an alloy thereof. For example, the layer 64A may be composed of a layer containing carbon and nitrogen (e.g., carbon nitride ($CN_x$)), which is more preferable because the layer 64A can be formed continuously with the layer 63aA (the nitrogen concentration preferably not more than 40 atomic percent). The layer 64A may be of any material that is conductive and keeps its resistance state unchanged.

For example, the layer 64A is formed by sputtering the metallic titanium target in a mixed atmosphere of argon and nitrogen, and thereby depositing titanium nitride (TiN) on the layer 63aA. The layer 64A has a film thickness of not less than on the order of 5 nm.

For example, deposition of the layer 64A is performed by depositing 5 nm of titanium nitride (TiN) on the layer 63aA, then sputtering the metallic titanium target in a mixed atmosphere of argon and nitrogen.

The layer 63bA has substantially the same configuration, and is deposited through substantially the same steps as the layer 63aA. Note that the layer 63bA may be of different composition and material, and may be deposited under different conditions from the layer 63aA, as long as it is a film containing carbon. That is, the layer 63bA needs only to be a layer that changes the above-mentioned electrical resistance value.

The layer 65A has substantially the same configuration, and is deposited through substantially the same steps as the layer 62A.

Figure 5:
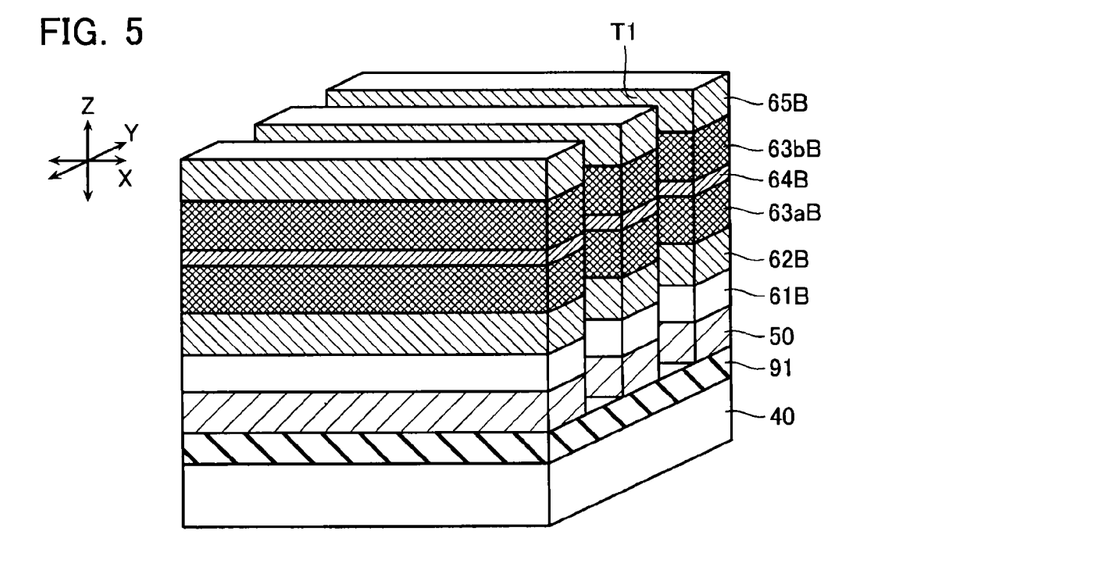
FIG. 5 is a schematic diagram illustrating a manufacturing process of the non-volatile semiconductor storage device according to the first embodiment.

Then, as illustrated in FIG. 5, trenches T1 are formed to penetrate the layers 50A, 61A, 62A, 63aA, 64A, 63bA, and 65A. The trenches T1 are formed in a stripe form so as to extend in the x direction with a predetermined pitch in the y direction. Through this step, the layers 50A become first conductive layers 50. In addition, the layers 61A, 62A, 63aA, 64A, 63bA, and layers 65A become layers 61B, 62B, 63aB, 64B, 63bB, and 65B, respectively, that are formed in a stripe form so as to extend in the x direction with a predetermined pitch in the y direction. The trenches T1 are formed using the lithography technology and Reactive Ion Etching.

Figure 6:
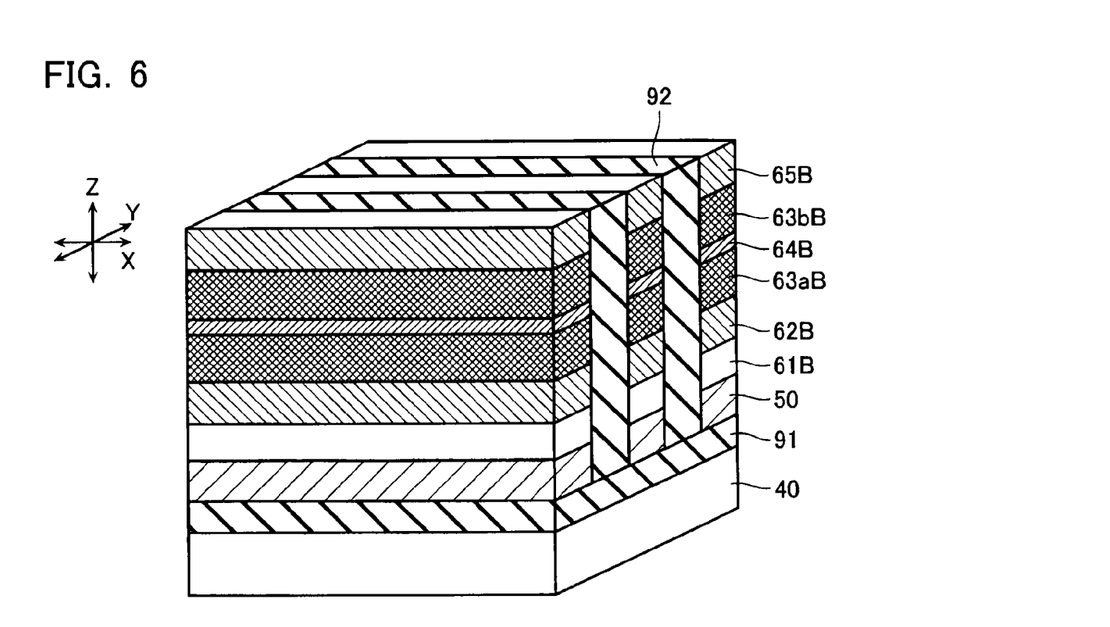
FIG. 6 is a schematic diagram illustrating a manufacturing process of the non-volatile semiconductor storage device according to the first embodiment.

Subsequently, as illustrated in FIG. 6, silicon oxide ($SiO_2$) is deposited to fill up the trenches T1, and then the resulting surface is flattened by the CMP (Chemical Mechanical Polishing) method to form interlayer insulation layers 92.

Figure 7:
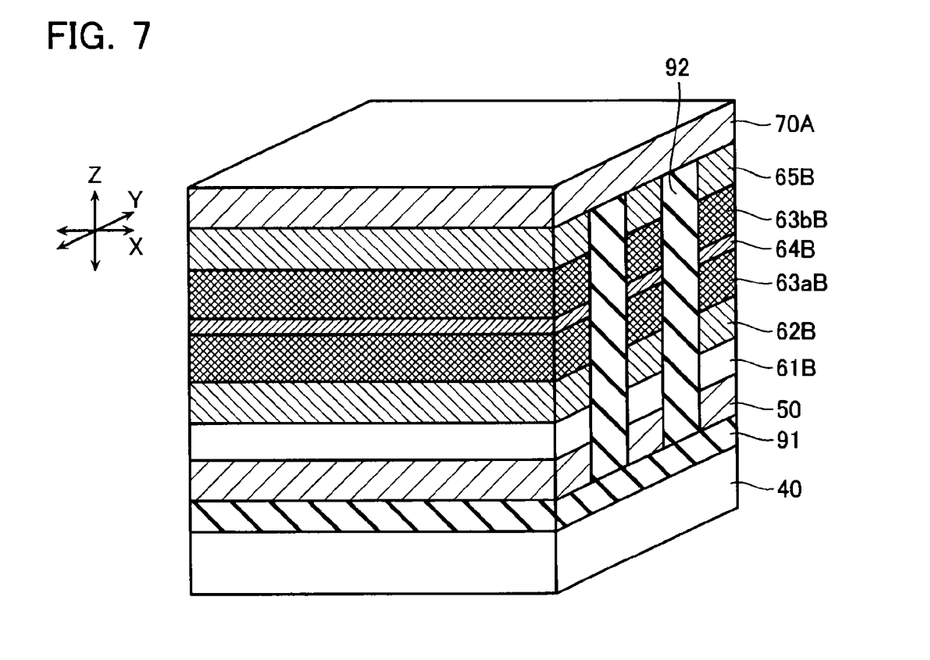
FIG. 7 is a schematic diagram illustrating a manufacturing process of the non-volatile semiconductor storage device according to the first embodiment.

Then, as illustrated in FIG. 7, Ti/TiN or W, WSi, or a laminate of these is deposited on the respective top surfaces of the interlayer insulation layers 92 and the layers 65B to form a layer 70A. The layer 70A is formed to expand in a two-dimensional manner in a direction parallel to the substrate 40.

Figure 8:
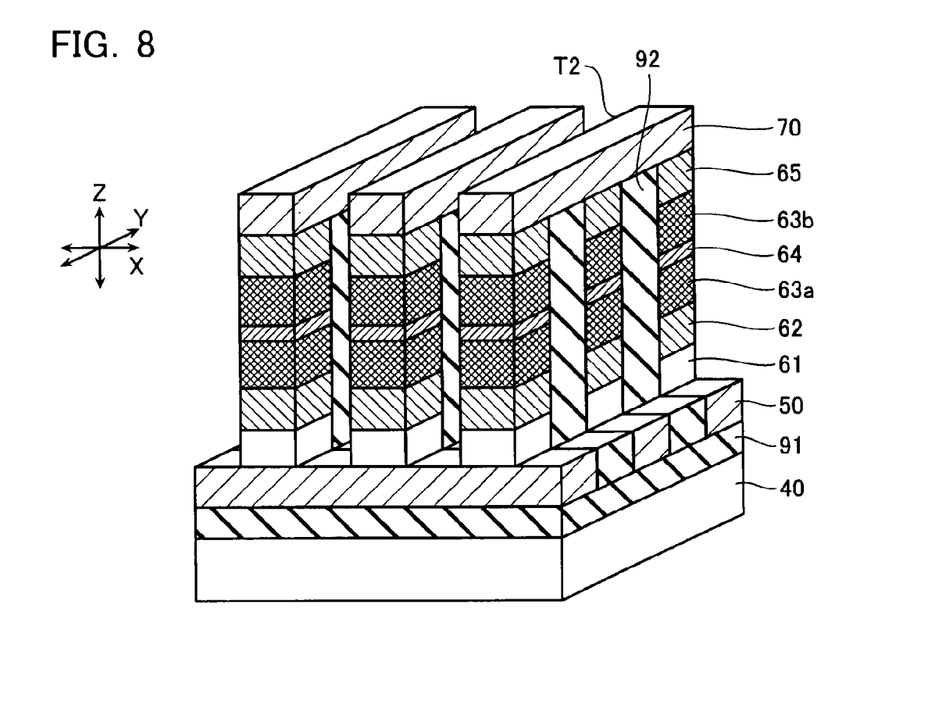
FIG. 8 is a schematic diagram illustrating a manufacturing process of the non-volatile semiconductor storage device according to the first embodiment.

Subsequently, as illustrated in FIG. 8, trenches T2 are formed to penetrate the layers 70A, 61B, 62B, 63aB, 64B, 63bB, and 65B. The trenches T2 are formed in a stripe form so as to extend in the y direction with a predetermined pitch in the x direction. Through this step, the layers 61B become diode layers 61. The layers 62B become first electrode layers 62. The layers 63aB become variable resistance layers 63a. The layers 64B become second electrode layers 64. The layers 63bB become variable resistance layers 63b. The layers 65B become third electrode layers 65. The layers 70A become second conductive layers 70. The trenches T2 are formed using the lithography technology and Reactive Ion Etching (RIE).

Figure 9:
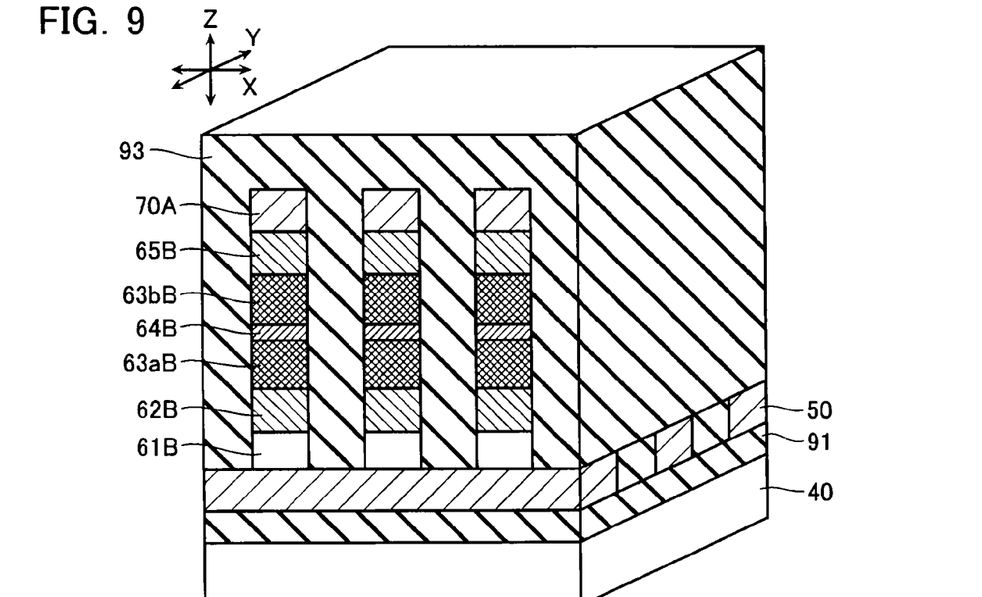
FIG. 9 is a schematic diagram illustrating a manufacturing process of the non-volatile semiconductor storage device according to the first embodiment.

Then, as illustrated in FIG. 9, silicon oxide ($SiO_2$) is deposited to fill up the trenches T2 and the second conductive layers 70, and then the resulting surface is flattened by the CMP (Chemical Mechanical Polishing) method to form an interlayer insulation layer 93.

Figure 10:
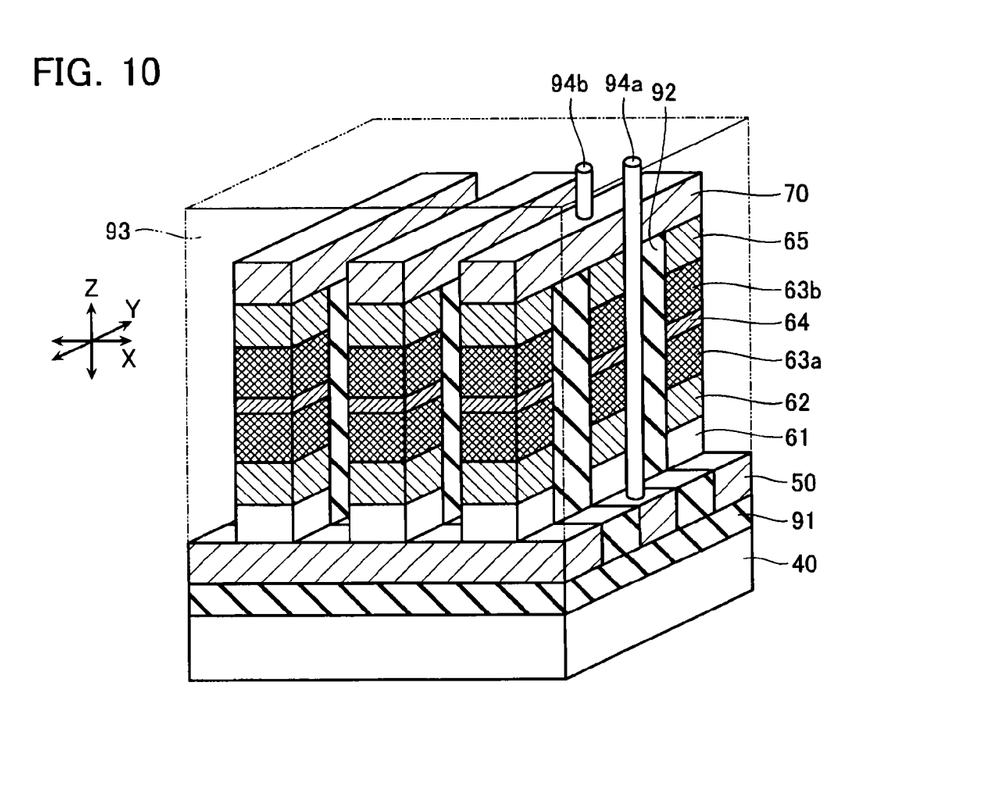
FIG. 10 is a schematic diagram illustrating a manufacturing process of the non-volatile semiconductor storage device according to the first embodiment.

Subsequently, as illustrated in FIG. 10, holes 94a and 94b are formed to penetrate the interlayer insulation layer 93. A hole 94a is formed to reach the top surface of a first conductive layer 50. A hole 94b is formed to reach the top surface of a second conductive layer 70.

After the step of FIG. 10, first and second plug layers 81a and 81b are formed to fill up the holes 94a and 94b, and then first and second wiring layers 82a and 82b are formed on the respective surfaces of the plug layers 81a and 81b. Through this step, the non-volatile semiconductor storage device according to the first embodiment is formed as illustrated FIG. 3.

[Characteristics of Variable Resistance Layers 63a and 63b]

Figure 11:
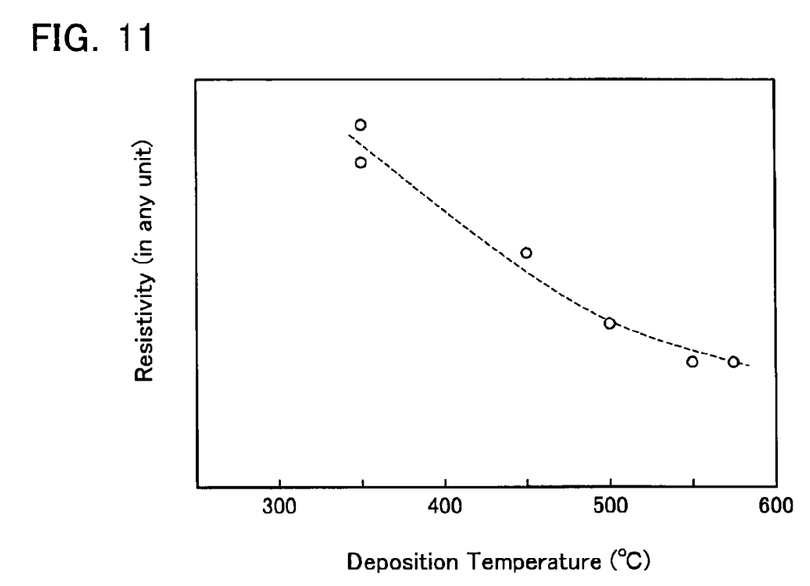
FIG. 11 illustrates a relation between deposition temperature (° C.) and resistivity at variable resistance layers 63a and 63b.
Figure 12:
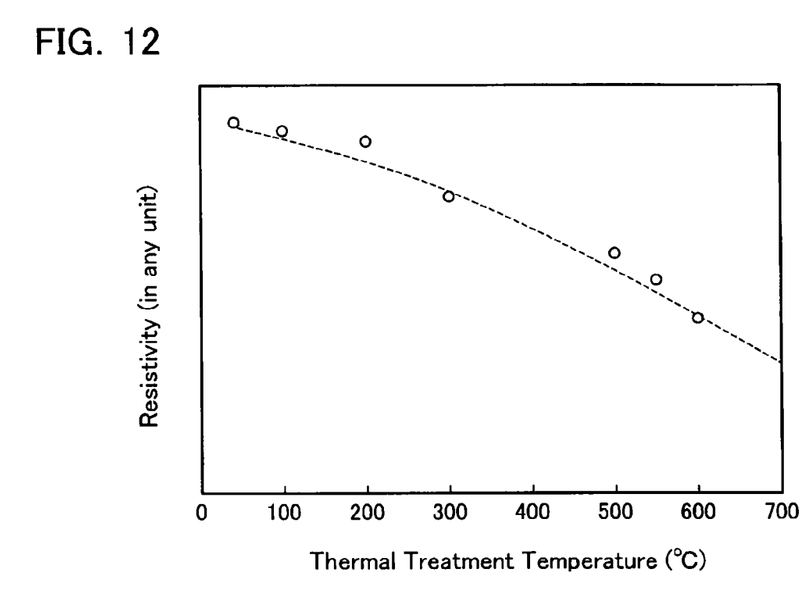
FIG. 12 illustrates a relation between thermal treatment temperature (° C.) and resistivity at the variable resistance layers 63a and 63b.

Referring now to FIGS. 11 and 12, the characteristics of the variable resistance layers 63a and 63b will be described below. FIG. 11 illustrates a relation between deposition temperature (° C.) and resistivity at variable resistance layers 63a and 63b. FIG. 12 illustrates a relation between thermal treatment temperature (° C.) and resistivity at the variable resistance layers 63a and 63b. FIG. 12 also illustrates a case where thermal treatment is performed in a nitrogen atmosphere for 60 seconds on a layer that has been deposited at 350° C.

As illustrated in FIG. 11, the lower the deposition temperature, the higher the relevant electrical resistivity, while the higher the deposition temperature, the lower the relevant electrical resistivity. In this embodiment, deposition temperatures around 500° C. are particularly preferable.

As illustrated in FIG. 12, the lower the thermal treatment temperature, the higher the relevant electrical resistivity, while the higher the thermal treatment temperature, the lower the relevant electrical resistivity. In this embodiment, thermal treatment temperatures around 500° C. are particularly preferable.

[Advantages of Non-Volatile Semiconductor Storage Device in First Embodiment]

Advantages of the non-volatile semiconductor storage device according to the first embodiment will now be described below. In the non-volatile semiconductor storage device in the first embodiment, each of the memory cells MC has variable resistance elements R1 and R2 connected in series (see FIG. 1). In this case, if both the variable resistance elements R1 and R2 operate normally, any one of the variable resistance elements R1 and R2 will change its resistance state, while the other not. This allows the variable resistance element R1 (or R2) without changing its resistance to mitigate any degradation associated with resistance change. In contrast, consider a case where any one of the variable resistance elements R1 and R2 leads to element destruction and enters a conducting state (a normally-low-resistance state) (i.e., in case of being defective due to the lifetime). In this case, the entire memory cell MC cannot be defective as the other of the variable resistance elements R1 (or R2) without leading to element destruction changes its resistance state.

In addition, each of the memory layers 60 according to the first embodiment has a second electrode layer 64 between a variable resistance layer 63a and a variable resistance layer 63b (see FIG. 3). Now consider a comparative example to explain advantages of the first embodiment. A memory layer of the comparative example does not have a second electrode layer 64. In addition, a variable resistance layer 63a and a variable resistance layer 63b are integrally and continuously formed with each other. In this comparative example, any defects caused at a variable resistance layer 63a propagate into the corresponding variable resistance layer 63b. In contrast, in the memory layer 60 according to the first embodiment, any defects caused at the variable resistance layer 63a cannot propagate into the variable resistance layer 63b because the layers 63a and 63b are separated by the second electrode layer 64.

That is, as described above, the non-volatile semiconductor storage device according to the first embodiment may yield high reliability compared to other non-volatile semiconductor storage devices with memory cells, each having a single variable resistance element.

In addition, according to the first embodiment, the variable resistance layers 63a and 63b (which function as variable resistance elements R1 and R2) contain carbon, and they are configured to be in a low-resistance state during deposition (see FIG. 3). Accordingly, the variable resistance layers 63a and 63b do not require any forming to form a filament path, as would be required for metal oxide (NiO or $SrZrO_3$). Therefore, the variable resistance layers 63a and 63b may eliminate the need for a large conducting current during forming, thus inhibiting any element destruction. In addition, the non-volatile semiconductor storage device according to the first embodiment may offer a reduction in the area occupied by the entire chip because it does not require any peripheral circuits for carrying out forming (those including such transistors with high breakdown voltage and driven by large current). Furthermore, the non-volatile semiconductor storage device according to the first embodiment may offer a reduction in the cross-sectional area of a wiring layer 80 (see FIG. 3) because it does not require any large current flowing into the variable resistance layers 63a and 63b, which may also reduce the respective areas occupied by the variable resistance layers 63a and 63b themselves.

In addition, according to the first embodiment, the memory layer 60 has the variable resistance layers 63a and 63b provided in the lamination direction (see FIG. 3). As described above, any of the variable resistance layers 63a and 63b functions as a repair circuit for repairing a memory cell MC. Thus, the memory layer 60 according to the first embodiment may occupy a smaller area than where the recovery circuits are arranged in a two-dimensional manner. Therefore, the non-volatile semiconductor storage device according to the first embodiment may reduce manufacturing costs.

As described above, it is noted that trench process is performed twice through the steps of FIGS. 5 to 8 to form columnar memory layers 60 (memory cells MC), according to the first embodiment. However, according to the manufacturing process of the present invention, columnar memory layers 60 may also be formed by forming a streaked processing mask with the lithography technology, and then performing Reactive Ion Etching on respective layers corresponding to memory layers 60 using that mask.

Second Embodiment

[Circuit Configuration of Non-Volatile Semiconductor Storage Device in Second Embodiment]

Figure 13:
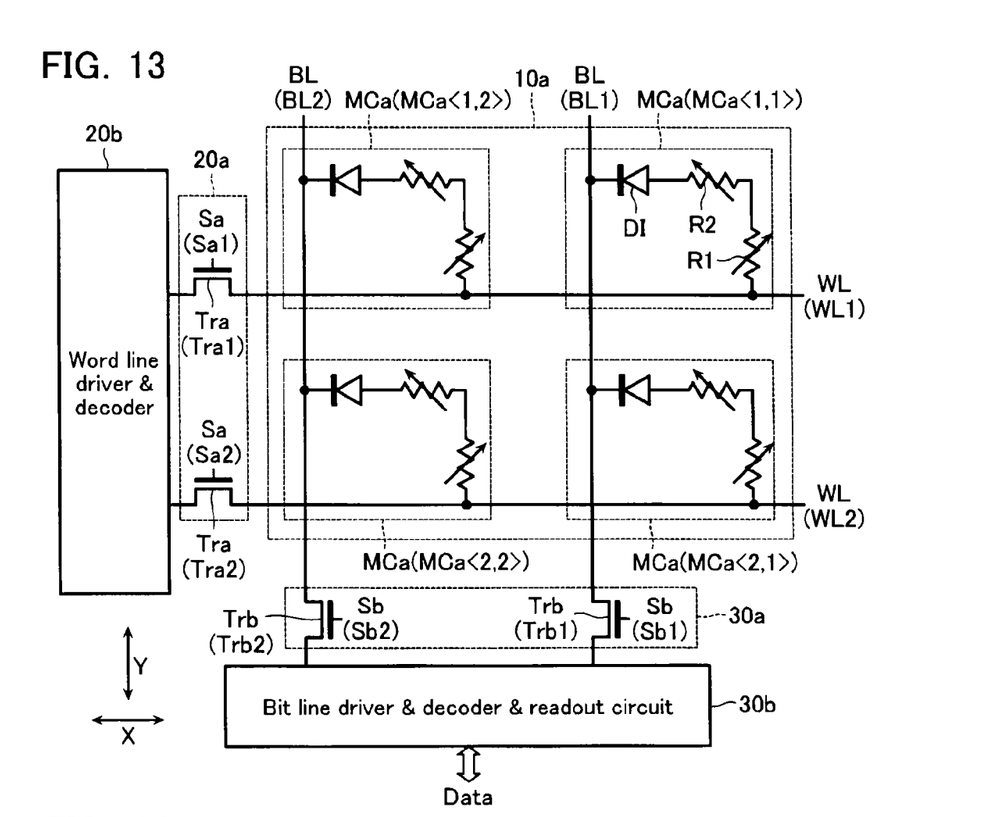
FIG. 13 is a circuit diagram of a non-volatile semiconductor storage device according to a second embodiment of the present invention.

Referring now to FIG. 13, a circuit configuration of a non-volatile semiconductor storage device according to a second embodiment will be described below. FIG. 13 is a circuit diagram of the non-volatile semiconductor storage device in the second embodiment. Note that the same reference numerals represent the same components as the first embodiment, and description thereof will be omitted in the second embodiment.

As illustrated in FIG. 13, the non-volatile semiconductor storage device in the second embodiment has a memory cell array 10a different from the first embodiment. The memory cell array 10a has memory cells MCa (MCa<1,1> to MCa<2, 2>). As in the first embodiment, each of the memory cells MCa includes variable resistance elements R1 and R2 as well as a diode DI. Each of the memory cells MCa has a different connection relationship between the variable resistance elements R1, R2 and the diode DI, as compared with the first embodiment.

The variable resistance elements R1 and R2 are connected in series. One ends of the variable resistance elements R1 are connected to the word lines WL. The other ends of the variable resistance elements R2 are connected to the anodes of the diodes DI. The cathodes of the diodes DI are connected to the bit lines BL.

[Lamination Structure of Memory Cell Array 10a in Second Embodiment]

Figure 14:
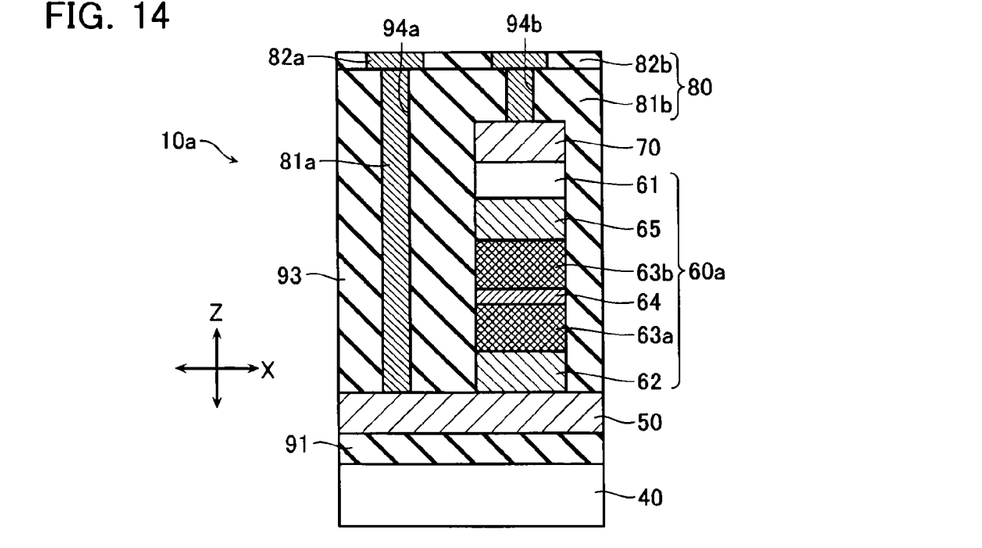
FIG. 14 is an enlarged cross-sectional view of a memory cell array 10a according to the second embodiment.

Referring now to FIG. 14, a lamination structure of a memory cell array 10a according to the second embodiment will be described below. FIG. 14 is an enlarged cross-sectional view of a memory cell array 10a according to the second embodiment.

As illustrated in FIG. 14, the memory cell array 10a in the second embodiment has a memory layer 60a different from the first embodiment. The memory layer 60a has, in order, a first electrode layer 62, a variable resistance layer 63a, a second electrode layer 64, a variable resistance layer 63b, a third electrode layer 65, and a diode layer 61 on a first conductive layer 50.

[Advantages of Non-Volatile Semiconductor Storage Device in Second Embodiment]

The non-volatile semiconductor storage device according to the second embodiment has the same features and advantages as the first embodiment.

Third Embodiment

[Circuit Configuration of Non-Volatile Semiconductor Storage Device in Third Embodiment]

Figure 15:
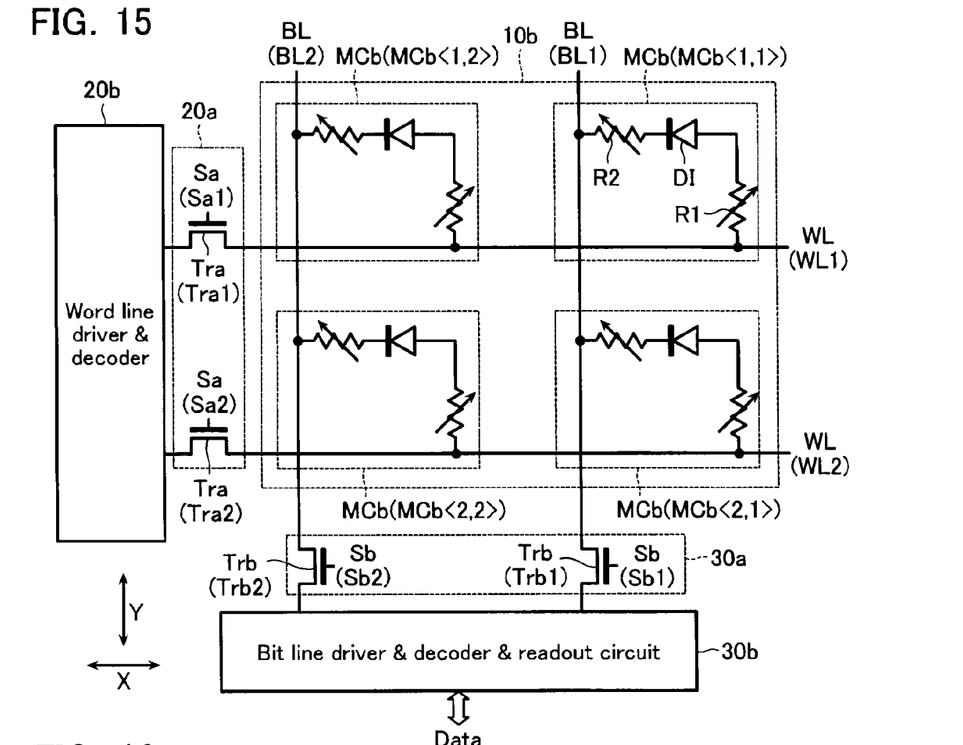
FIG. 15 is a circuit diagram of a non-volatile semiconductor storage device according to a third embodiment of the present invention.

Referring now to FIG. 15, a circuit configuration of a non-volatile semiconductor storage device according to a third embodiment will be described below. FIG. 15 is a circuit diagram of the non-volatile semiconductor storage device in the third embodiment. Note that the same reference numerals represent the same components as the first and second embodiments, and description thereof will be omitted in the third embodiment.

As illustrated in FIG. 15, the non-volatile semiconductor storage device in the third embodiment has a memory cell array 10b different from the first embodiment. The memory cell array 10b has memory cells MCb (MCb<1,1> to MCb<2, 2>). As in the first embodiment, each of the memory cells MCb includes variable resistance elements R1 and R2 as well as a diode DI. Each of the memory cells MCb has a different connection relationship between the variable resistance elements R1, R2 and the diode DI, as compared with the first and second embodiments.

The variable resistance elements R1 are connected in series with the variable resistance elements R2 via the respective diodes DI. One ends of the variable resistance elements R1 are connected to the word lines WL, and the other ends connected to the anodes of the diodes DI. The cathodes of the diodes DI are connected to one ends of the variable resistance elements R2. The other ends of the variable resistance elements R2 are connected to the bit lines BL.

[Lamination Structure of Memory Cell Array 10b in Third Embodiment]

Figure 16:
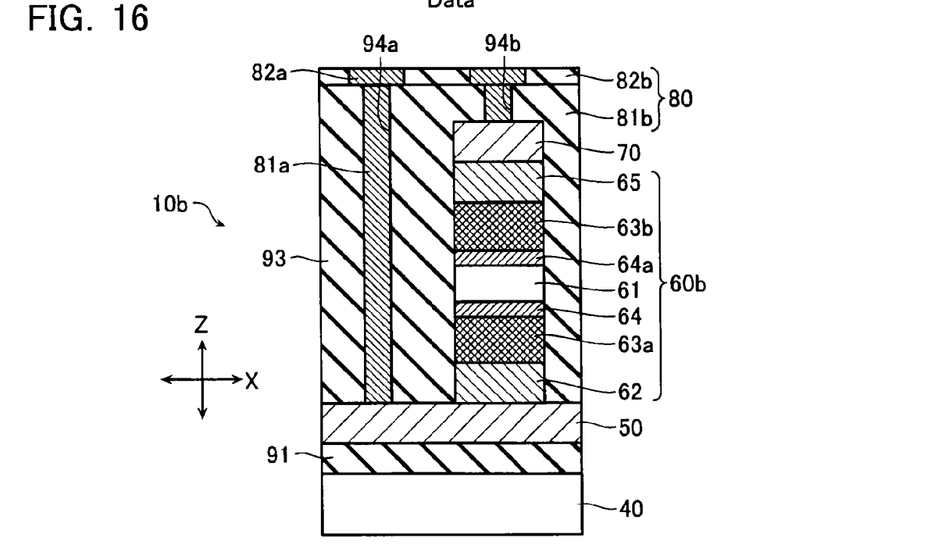
FIG. 16 is an enlarged cross-sectional view of a memory cell array 10a according to the third embodiment.

Referring now to FIG. 16, a lamination structure of a memory cell array 10b according to the third embodiment will be described below. FIG. 16 is an enlarged cross-sectional view of a memory cell array 10b according to the third embodiment.

As illustrated in FIG. 16, the memory cell array 10b according to the third embodiment has memory layers 60b different from the first embodiment. The memory layer 60b has, in order, a first electrode layer 62, a variable resistance layer 63a, a second electrode layer 64, a diode layer 61, a second electrode layer 64a, a variable resistance layer 63b, and a third electrode layer 65 on a first conductive layer 50. The second electrode layer 64a has the same configuration as the second electrode layer 64.

[Advantages of Non-Volatile Semiconductor Storage Device in Third Embodiment]

The non-volatile semiconductor storage device according to the third embodiment has the same features and advantages as the first embodiment.

Fourth Embodiment

[Circuit Configuration of Non-Volatile Semiconductor Storage Device in Fourth Embodiment]

Figure 17:
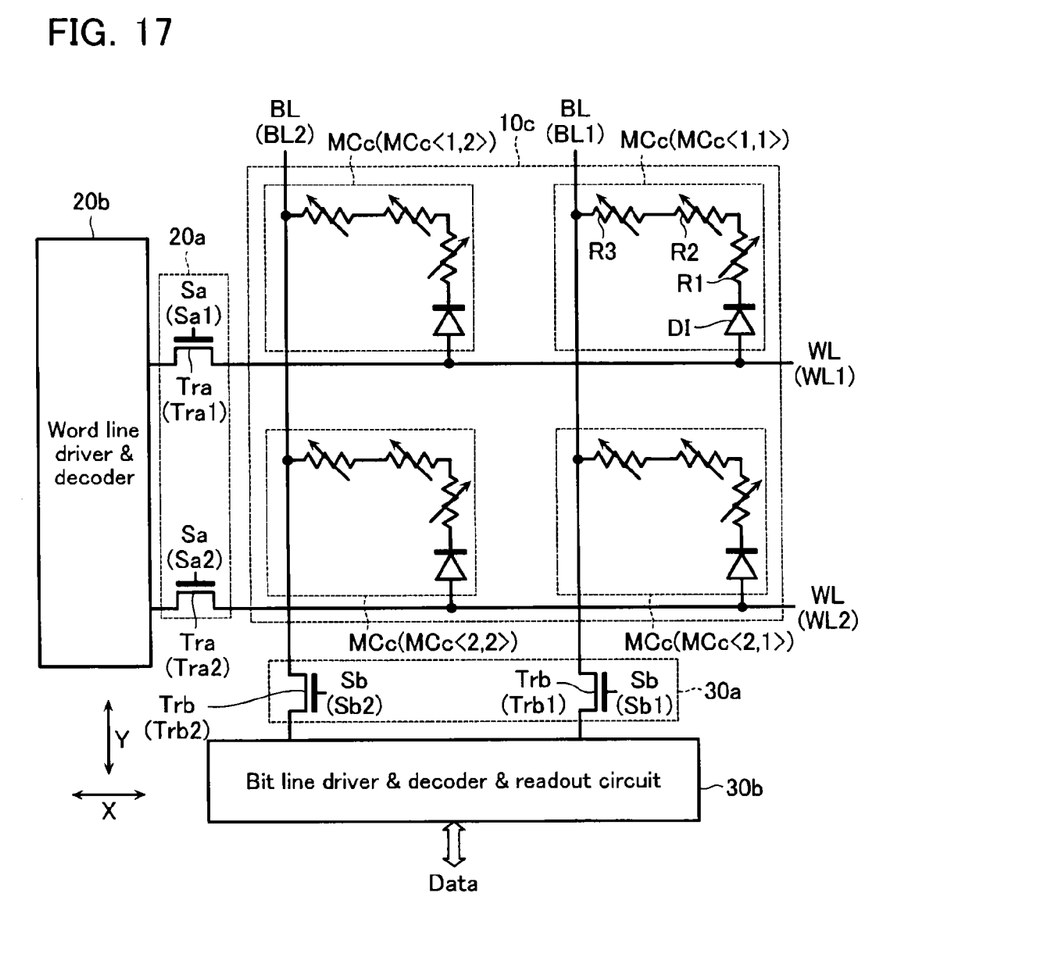
FIG. 17 is a circuit diagram of a non-volatile semiconductor storage device according to a fourth embodiment of the present invention.

Referring now to FIG. 17, a circuit configuration of a non-volatile semiconductor storage device according to a fourth embodiment will be described below. FIG. 17 is a circuit diagram of the non-volatile semiconductor storage device in the fourth embodiment. Note that the same reference numerals represent the same components as the first to third embodiments, and description thereof will be omitted in the fourth embodiment.

As illustrated in FIG. 17, the non-volatile semiconductor storage device in the fourth embodiment has a memory cell array 10c different from the first embodiment. The memory cell array 10c has memory cells MCc (MCc<1,1> to MCc<2, 2>). As in the first embodiment, each of the memory cells MCc includes variable resistance elements R1 and R2 as well as a diode DI. Each of the memory cells MCc further includes a variable resistance element R3.

Each diode DI has an anode connected to the corresponding word line WL and a cathode connected to one end of the corresponding variable resistance element R1. The variable resistance elements R1, R2, and R3 are connected in series. The other ends of the variable resistance elements R3 are connected to the bit lines BL.

[Lamination Structure of Memory Cell Array 10c in Fourth Embodiment]

Figure 18:
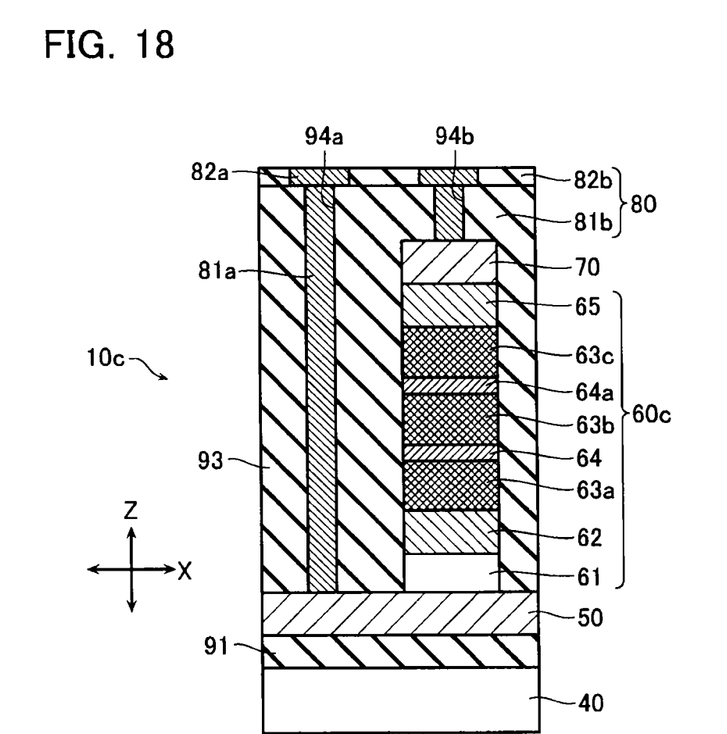
FIG. 18 is an enlarged cross-sectional view of a memory cell array 10a according to the fourth embodiment.

Referring now to FIG. 18, a lamination structure of a memory cell array 10c according to the fourth embodiment will be described below. FIG. 18 is an enlarged cross-sectional view of a memory cell array 10c according to the fourth embodiment.

As illustrated in FIG. 18, the memory cell array 10c according to the fourth embodiment has a memory layer 60c different from the first embodiment. The memory layer 60c has, in order, a diode layer 61, a first electrode layer 62, a variable resistance layer 63a, a second electrode layer 64, a variable resistance layer 63b, a second electrode layer 64a, a variable resistance layer 63c, and a third electrode layer 65 on a first conductive layer 50. The variable resistance layer 63c has the same configuration as the variable resistance layers 63a and 63b.

[Advantages of Non-Volatile Semiconductor Storage Device in Fourth Embodiment]

The non-volatile semiconductor storage device according to the fourth embodiment has the same features and advantages as the first embodiment. The non-volatile semiconductor storage device in the fourth embodiment further comprises variable resistance elements R3 (variable resistance layers 63c) in addition to the configuration described in the first embodiment. Therefore, the non-volatile semiconductor storage device in the fourth embodiment may reduce more chip area used for the recovery circuits than in the first embodiment.

Other Embodiments

While embodiments of the present invention have been described with respect to a non-volatile semiconductor storage device, the present invention is not intended to be limited to the disclosed embodiments and various other changes, additions, replacements or the like may be made thereto without departing from the spirit of the invention. For example, the manufacturing process of the variable resistance layers 63a is based on the CVD method according to the above-mentioned embodiments. However, the manufacturing process of the variable resistance layers 63a may be based on the low pressure thermal CVD method, the sputtering method, or other thin film metal deposition methods. When the sputtering method is used for film formation, a carbon target of graphite is sputtered with non-volatile gas such as argon to form a film. If the resultant carbon film (variable resistance layer) has a high electrical resistance value, it is desirable to reduce the electrical resistance value with thermal treatment at not less than 600° C.

What is claimed is:

1. A method of operation of a non-volatile semiconductor storage device comprising memory cells being arranged at an intersection between a first wiring and a second wiring,
   the memory cells having a first electrode layer, and first and second variable resistance layers laminated over the first electrode layer, a second electrode layer formed between the first and second variable resistance layers, and a third electrode layer formed over the top one of the variable resistance layers; and
   the method comprising:
   applying a first voltage to the first wiring connected to the first electrode side, while applying a second voltage lower than the first voltage to the second wiring connected to the third electrode side, during a write operation,
   when the first and second variable resistance layers operate normally, any one of the first and second variable resistance layers changes its resistance state; and
   when any one of the first and second variable resistance layers is destroyed, the other of the variable resistance layers changes its resistance state.

2. The method of operation according to claim 1, wherein destroying a variable resistance layer produces a low-resistance state in which a high voltage need not be applied to form a filament path.

3. The method of operation according to claim 1, wherein each of the variable resistance layers has a hydrogen concentration of not more than 20%.

4. The method of operation according to claim 1, wherein each of the variable resistance layers is composed of a mixture of a graphite component with a minute crystal structure and carbon with a coarse crystal structure.

5. The method of operation according to claim 1, wherein each of the variable resistance layers is composed in part or entirely of a carbon nanomaterial.

6. The method of operation according to claim 1, wherein the second electrode layer is composed of a layer containing carbon and nitrogen.

7. The method of operation according to claim 1, wherein the first electrode layer and the third electrode layer are composed of any of metal, alloy, or metal nitride.

8. The method of operation according to claim 1, wherein each of the memory cells comprises a diode layer functioning as a diode.

9. The method of operation according to claim 8, wherein the diode layer is formed under the bottom one of the variable resistance layers.

10. The method of operation according to claim 8, wherein the diode layer is formed between the variable resistance layers.

11. The method of operation according to claim 8, wherein the diode layer is formed over the top one of the variable resistance layers.

12. The method of operation according to claim 8, wherein a forming operation need not be carried out.

13. The method of operation according to claim 12, wherein the first and second variable resistance layers are composed of a material containing carbon.

14. The method of operation according to claim 1, wherein
- a bottom one of the first and second variable resistance layers contacts the first electrode layer, and
- a top one of the plurality of variable resistance layers contacts the third electrode layer.

* * * * *